United States Patent
Maekawa et al.

(10) Patent No.: US 10,883,166 B2
(45) Date of Patent: Jan. 5, 2021

(54) SURFACE-COATED CUBIC BORON NITRIDE SINTERED MATERIAL TOOL

(71) Applicant: MITSUBISHI MATERIALS CORPORATION, Tokyo (JP)

(72) Inventors: Takuya Maekawa, Joso (JP); Masakuni Takahashi, Anpachi-gun (JP); Shun Sato, Anpachi-gun (JP); Kenji Yumoto, Anpachi-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 101 days.

(21) Appl. No.: 16/066,017

(22) PCT Filed: Dec. 22, 2016

(86) PCT No.: PCT/JP2016/088417
§ 371 (c)(1),
(2) Date: Jun. 25, 2018

(87) PCT Pub. No.: WO2017/111044
PCT Pub. Date: Jun. 29, 2017

(65) Prior Publication Data
US 2019/0017162 A1 Jan. 17, 2019

(30) Foreign Application Priority Data
Dec. 25, 2015 (JP) .................. 2015-253641
Dec. 20, 2016 (JP) .................. 2016-246479

(51) Int. Cl.
*B23B 27/14* (2006.01)
*C23C 14/06* (2006.01)
(Continued)

(52) U.S. Cl.
CPC .......... *C23C 14/0641* (2013.01); *B23B 27/14* (2013.01); *C04B 35/5611* (2013.01);
(Continued)

(58) Field of Classification Search
USPC .......... 51/307, 309; 428/216, 336, 697, 698, 428/699, 704
See application file for complete search history.

(56) References Cited

U.S. PATENT DOCUMENTS 6,316,094 B1 * 11/2001 Fukaya ............... C04B 35/5831
428/699
2006/0154108 A1 7/2006 Fukui et al.
(Continued)

FOREIGN PATENT DOCUMENTS

EP 2591869 A1 5/2013
EP 2979789 A1 2/2016
(Continued)

OTHER PUBLICATIONS

Extended European Search Report dated Apr. 26, 2019 for the corresponding European Application No. 16878930.3.
(Continued)

*Primary Examiner* — Archene A Turner
(74) *Attorney, Agent, or Firm* — Leason Ellis LLP

(57) ABSTRACT

The present invention is directed to a surface-coated cubic boron nitride sintered material tool including a cBN substrate and a hard coating layer formed on a surface of the cBN substrate and having an alternate laminated structure of A layer and B layer. The cBN substrate (sintered material) includes: a Ti compound, WC, AlN, $TiB_2$, $Al_2O_3$, and cBN. The A layer has a composition of $(Ti_{1-x}Al_x)N$ ($0.4 \le x \le 0.7$ in terms of atomic ratio). The B layer has a composition of $(Cr_{1-y-z}Al_yM_z)N$ ($0.03 \le y \le 0.4$ and $0 \le z \le 0.05$ in terms of atomic ratio). A plastic deformation work ratio of the B layer is 0.35 to 0.50.

6 Claims, 3 Drawing Sheets

(51) Int. Cl.

| | |
|---|---|
| *C04B 35/5831* | (2006.01) |
| *C04B 41/89* | (2006.01) |
| *C04B 35/58* | (2006.01) |
| *C04B 41/52* | (2006.01) |
| *C04B 35/645* | (2006.01) |
| *C04B 35/56* | (2006.01) |
| *C23C 28/04* | (2006.01) |
| *C23C 28/00* | (2006.01) |
| *C04B 41/87* | (2006.01) |
| *C04B 41/88* | (2006.01) |
| *C23C 14/32* | (2006.01) |

(52) U.S. Cl.
CPC .. *C04B 35/58014* (2013.01); *C04B 35/58021* (2013.01); *C04B 35/5831* (2013.01); *C04B 35/645* (2013.01); *C04B 41/52* (2013.01); *C04B 41/87* (2013.01); *C04B 41/88* (2013.01); *C04B 41/89* (2013.01); *C23C 14/325* (2013.01); *C23C 28/044* (2013.01); *C23C 28/42* (2013.01); *B23B 2224/24* (2013.01); *C04B 2235/3217* (2013.01); *C04B 2235/386* (2013.01); *C04B 2235/3813* (2013.01); *C04B 2235/3847* (2013.01); *C04B 2235/3865* (2013.01); *C04B 2235/5436* (2013.01); *C04B 2235/5445* (2013.01); *C04B 2235/6581* (2013.01); *C04B 2235/782* (2013.01); *C04B 2235/785* (2013.01); *C04B 2235/786* (2013.01)

(56) References Cited

U.S. PATENT DOCUMENTS

| | | | |
|---|---|---|---|
| 2011/0183131 A1* | 7/2011 | Maeda | B23F 21/00 428/216 |
| 2012/0090247 A1* | 4/2012 | Miura | C23C 14/0036 51/309 |
| 2016/0136735 A1* | 5/2016 | Matsuda | B23B 27/148 407/119 |

FOREIGN PATENT DOCUMENTS

| | | | |
|---|---|---|---|
| JP | 08-081270 | * | 3/1996 |
| JP | 08-119774 A | | 5/1996 |
| JP | 2001-198709 A | | 7/2001 |
| JP | 2008-188734 A | | 8/2008 |
| JP | 4191663 B | | 12/2008 |
| JP | 2009-101491 A | | 5/2009 |
| JP | 2010-012564 A | | 1/2010 |
| JP | 2011-218513 A | | 11/2011 |
| JP | 2014-091169 A | | 5/2014 |
| JP | 2017-042906 A | | 3/2017 |
| WO | WO-2005/053887 A | | 6/2005 |
| WO | 2015/163059 | * | 10/2015 |

OTHER PUBLICATIONS

International Search Report dated Mar. 21, 2017 for the corresponding PCT Application No. PCT/JP2016/088417.

* cited by examiner

SURFACE-COATED CUBIC BORON NITRIDE SINTERED MATERIAL TOOL

CROSS REFERENCE TO RELATED PATENT APPLICATIONS

This application is a U.S. National Phase Application under 35 U.S.C. § 371 of International Patent Application No. PCT/JP2016/088417 filed on Dec. 22, 2016 and claims the benefit of Japanese Patent Applications No. 2015-253641, filed on Dec. 25, 2015, and No. 2016-246479, filed on Dec. 20, 2016, all of which are incorporated herein by reference in their entireties. The International Application was published in Japanese on Jun. 29, 2017 as International Publication No. WO/2017/111044 under PCT Article 21(2).

FIELD OF THE INVENTION

The present invention relates to a surface-coated cubic boron nitride sintered material tool having both wear resistance and fracture resistance. Specifically, the invention relates to a surface-coated tool having, as a tool body, a cubic boron nitride (hereinafter, also referred to as "cBN") sintered material having excellent wear resistance and fracture resistance in strong intermittent cutting of alloy steel or the like and exhibiting excellent cutting performance for long-term use (hereinafter, also referred to as "coated cBN tool").

BACKGROUND OF THE INVENTION

In general, surface-coated cutting tools include indexable inserts which are detachably attached to a tip portion of an insert holder in turning or planning of work materials such as various kinds of steel or cast iron, drills or miniature drills which are used in drilling or the like of the work materials, and solid end mills which are used in face milling, grooving, shoulder milling, or the like of the work materials. In addition, throw away end mill tools or the like have been known which include the indexable insert detachably attached thereto and perform cutting in the same manner as the solid end mills.

In addition, as a coated tool, coated tools in which the surface of a body made of tungsten carbide (hereinafter, represented by WC)-based cemented carbide, titanium carbonitride (hereinafter, represented by TiCN)-based cermet, or a cubic boron nitride sintered material (hereinafter, represented by cBN) (hereinafter, collectively referred to as a tool body) is coated with a complex nitride layer of Cr and Al ((Cr, Al)N) or a complex nitride layer of Ti and Al ((Ti, Al)N) as a hard coating layer through an arc ion plating method have been known.

In addition, many proposals have been made in order to improve the cutting performance of the coated tool.

For example, in Japanese Unexamined Publication No. 2008-188734, it is proposed that a hard coating layer formed of a (Cr, Al)N layer, which has biaxial crystal orientation and is formed of a complex nitride layer of Cr and Al satisfying a composition formula $(Cr_{1-x}Al_x)N$ (x is 0.40 to 0.70 in terms of atomic ratio), and in which in a case where crystal orientation analysis by EBSD is carried out in regard to the complex nitride layer, an area ratio of crystal grains having crystal orientation <100> within a range of 0 to 15 degrees from a normal direction of a surface polishing face is 50% or more, and an area ratio of crystal grains having crystal orientation <100> within a range of 15 degrees around a maximum peak existing within a range of 0 to 54 degrees with respect to an optional direction orthogonal to a normal line of the surface polishing face is 50% or more, is formed on a surface of a tool body, and thus the fracture resistance of the hard coating layer in heavy cutting is improved.

In Japanese Unexamined Publication No. 2010-12564, it is proposed that a hard coating layer 1 is coated on the surface side, a hard coating layer 2 is coated on the tool body side, the hard coating layer 1 is $(Cr_{1-a}Al_a)N_x$, where $0.5 \leq a \leq 0.75$ and $0.9 \leq x \leq 1.1$, the hard coating layer 2 is $(Ti_bAl_{1-b})N_y$, where $0.4 \leq b \leq 0.6$ and $0.9 \leq y \leq 1.1$, in a case where the lattice constant of the (200) plane of the hard coating layer 1 by X-ray diffraction is $\alpha_1$ (nm), $0.411 \leq \alpha_1 \leq 0.415$, and in a case where the lattice constant of the (200) plane of the hard coating layer 2 is $\alpha_2$ (nm), $0.413 \leq \alpha_2 \leq 418$, so that high hardness is maintained and a reduction in the residual compression stress is achieved, and moreover, the adhesion strength between the hard coating layers 1 and 2 is increased to increase the service life of the tool of a coated tool.

In Japanese Unexamined Publication No. H8-119774 and Japanese Patent No. 4191663, it is proposed that on a body formed of a cBN sintered material containing 20 vol % or more of cubic boron nitride, a hard heat-resistant film having a composition represented by $(Ti_{1-x}Al_x)N$ (here, $0.3 \leq x \leq 0.7$) is provided at a place related to at least cutting to improve the strength and the wear resistance as a cutting tool.

In Japanese Unexamined Publication No. 2009-101491, it is proposed that in a case where a lower layer formed of a (Ti, Al)-based complex nitride or complex carbonitride layer and an upper layer formed of a (Cr, Al)-based complex nitride layer are coated on a surface of a tool body made of tungsten carbide-based cemented carbide or titanium carbonitride-based cermet, and the upper layer is configured to have an alternate laminated structure of a thin layer A having a cubic structure and a thin layer B in which a cubic structure and a hexagonal structure are mixed, the lubricity and the wear resistance in high-speed strong intermittent cutting are improved.

PTL 5 describes that in a case where the lower layer is represented by a composition formula $(Ti_{1-Q-R}Al_QM_{1R})(C, N)$, the lower layer is a complex nitride or complex carbonitride layer of Ti, Al, and $M_1$ satisfying $0.4 \leq Q \leq 0.65$ and $0 \leq R \leq 0.1$ (Q represents a content ratio of Al in terms of atomic ratio, R represents a total content ratio of the component $M_1$ in terms of atomic ratio, and the component $M_1$ represents one or more elements selected from Si, B, Zr, Y, V, W, Nb, and Mo.), in a case where the thin layer A is represented by a composition formula $(Cr_{1-\alpha-\beta}Al_\alpha M_{2\beta})N$, the thin layer A is a complex nitride layer of Cr, Al, and $M_2$ having a cubic structure satisfying $0.25 \leq \alpha \leq 0.65$ and $0 < \beta \leq 0.1$ ($\alpha$ represents a content ratio of Al in terms of atomic ratio, $\beta$ represents a total content ratio of the component $M_2$ in terms of atomic ratio, and the component $M_2$ represents one or more elements selected from Zr, Y, V, W, Nb, Mo, and Ti.), and in a case where the thin layer B is represented by a composition formula $(Cr_{1-\gamma-\delta}Al_\gamma M_{3\delta})N$, the thin layer B is a complex nitride layer of Cr, Al, and $M_3$ satisfying $0.75 \leq \gamma \leq 0.95$ and $0 < \delta \leq 0.1$ ($\gamma$ represents a content ratio of Al in terms of atomic ratio, $\delta$ represents a total content ratio of the component $M_3$ in terms of atomic ratio, and the component $M_3$ represents one or more elements selected from Zr, Y, V, W, Nb, Mo, and Ti.).

TECHNICAL PROBLEM

In recent years, performance of machine tools has been significantly improved, and there is a strong demand for power saving, energy saving, and cost reduction in cutting. In addition, there is a tendency that the efficiency of the cutting is enhanced.

The conventional coated tools proposed in Japanese Unexamined Publication No. 2008-188734, Japanese Unexamined Publication No. 2010-12564, Japanese Unexamined Patent Application, First Publication No. H8-119774 and Japanese Unexamined Publication No. 2009-101491 have no particular problems when being used for cutting of steel or cast iron under normal conditions. However, particularly, in a case where the coated tools are used under strong intermittent cutting conditions in which an intermittent and impact high load acts on a cutting edge, fractures or the like are likely to occur, and satisfactory wear resistance may not be obtained. Accordingly, the end of the service life of the tool is reached in a relatively short period of time.

SOLUTION TO PROBLEM

Accordingly, the inventors have conducted intensive studies from the above-described viewpoint to develop a coated tool in which a hard coating layer exhibits excellent fracture resistance and wear resistance in strong intermittent cutting, and as a result, obtained the following knowledge.

(a) First, from Japanese Unexamined Publication No. 2008-188734, Japanese Unexamined Publication No. 2010-12564 and Japanese Unexamined Publication No. 2009-101491, it has already been known that in conventional coated tools having a hard coating layer formed of a (Cr, Al)N layer or a (Cr, Al, M)N layer, Al as a constituent component of the hard coating layer improves high-temperature hardness and heat resistance, Cr improves a high-temperature strength, and acts to improve high-temperature oxidation resistance in a state in which Cr and Al are contained in a coexistent manner, characteristics of the hard coating layer are improved in accordance with the kind of the component M such that in a case where the additional component M is Zr, heat-resistant plastic deformability is improved, in a case where the additional component M is V, lubricity is improved, in a case where the additional component M is Nb, high-temperature wear resistance is improved, in a case where the additional component M is Mo, welding resistance is improved, in a case where the additional component M is W, heat radiation is improved, and in a case where the additional component M is Ti, high-temperature hardness is further improved, and the fracture resistance, the welding resistance, the oxidation resistance, and the wear resistance of the hard coating layer are improved in a case where the hard coating layer contains the components M.

(b) In addition, from Japanese Unexamined Publication No. 2010-12564, Japanese Unexamined Patent Application, First Publication No. H8-119774, Japanese Patent No. 4191663 and Japanese Unexamined Publication No. 2009-101491, it has also been known that the (Ti, Al)N layer has an excellent high-temperature strength and has an excellent high-adhesion strength to the tool body and the (Cr, Al, M)N layer, and thus in a case where the hard coating layer is formed as a layer having a lamination structure of A layer and B layer in which the A layer is the (Ti, Al)N layer and the B layer is the (Cr, Al, M)N layer, the whole hard coating layer has an excellent high-temperature strength, and a coated tool having excellent fracture resistance is provided.

(c) However, the inventors have found that in a case where the hard coating layer has an alternate laminated structure in which at least one A layer and at least one B layer are alternately laminated, and composition ranges of the constituent components of the A layer and the B layer are appropriately selected, the hardness and the plastic deformability of the B layer can be balanced, and thus an intermittent and impact high load acting on a cutting edge in cutting can be relaxed, and the fracture resistance of the hard coating layer can be improved.

In addition, the inventors have performed a nano-indentation test on the B layer ((Cr, Al, M)N layer) according to the invention, and confirmed that the value of a plastic deformation work ratio $W_{plast}/(W_{plast}+W_{elast})$, is within a range of 0.35 to 0.50.

(d) Moreover, the inventors have found that in a case where the component composition of the tool body made of a cubic boron nitride sintered material (hereinafter, also referred to as "cBN substrate") is regulated within a predetermined range, the adhesion strength between the cBN substrate and the hard coating layer having an alternate laminated structure of A layer and B layer can be improved, and thus it is possible to prevent chipping, fractures, peeling or the like of the hard coating layer, and further excellent fracture resistance and wear resistance are thus exhibited for long-term use.

SUMMARY OF THE INVENTION

The invention has been contrived based on the above-described study results, and has the following configuration.

"(1) A surface-coated cubic boron nitride sintered material tool including: a tool body which is made of a cubic boron nitride sintered material; and a hard coating layer formed on a surface of the tool body, the hard coating layer being made of an alternate laminated structure, in which at least one A layer and at least one B layer are alternately laminated, and having a total layer thickness of 0.5 to 4.0 μm, wherein (a) the cubic boron nitride sintered material has a composition including: 10 to 50 vol % of one or more of TiC, TiN, and TiCN; 0.1 to 2 vol % of WC; 0.3 to 5 vol % of AlN; 2 to 10 vol % of $TiB_2$; 1.5 to 10 vol % of $Al_2O_3$; and 30 to 80 vol % of cBN (cubic boron nitride), (b) the A layer is a Ti and Al complex nitride layer, which has an average single layer thickness of 0.1 to 3.0 μm and has an average composition satisfying $0.4 \leq x \leq 0.7$ (x represents a content ratio of Al in terms of atomic ratio) in a case where the A layer is represented by a composition formula $(Ti_{1-x}Al_x)N$, (c) the B layer is a Cr, Al and M complex nitride layer, which has an average single layer thickness of 0.1 to 3.0 μm and has an average composition satisfying $0.03 \leq y \leq 0.4$ and $0 \leq z \leq 0.05$ (y represents a content ratio of Al in terms of atomic ratio, z represents a total content ratio of the component M in terms of atomic ratio, and the component M represents one or more elements selected from group 4a elements excluding Cr, group 5a elements, group 6a elements, B and Si in the periodic table) in a case where the B layer is represented by a composition formula $(Cr_{1-y-z}Al_yM_z)N$, and (d) a hardness of the B layer obtained by performing a nano-indentation test with a load set such that an indentation depth is 1/10 or less of the layer thickness is in a range of 28 to 40 GPa, and a value of a plastic deformation work ratio $W_{plast}/(W_{plast}+W_{elast})$ is in a range of 0.35 to 0.50.

(2) The surface-coated cubic boron nitride sintered material tool according to the above-described (1), wherein a total volume percentage (vol %) of cubic boron nitride grains having a grain size of 3D (μm) or more in the cubic boron nitride sintered material is 5 vol % or less in a case where an average grain size of cubic boron nitride grains as a raw material powder of the cubic boron nitride sintered material is defined by D (μm).

(3) The surface-coated cubic boron nitride sintered material tool according to the above-described (1), wherein a total volume percentage (vol %) of cubic boron nitride grains having a grain size of 3D' (μm) or more in the cubic boron nitride sintered material is 5 vol % or less in a case where an average grain size of cubic boron nitride grains in the cubic boron nitride sintered material is defined by D' (μm).

A coated tool (surface-coated cubic boron nitride sintered material tool) according to the invention has a hard coating layer having an alternate laminated structure in which at least one A layer formed of $(Ti_{1-x}Al_x)N$ and at least one B layer formed of $(Cr_{1-y-z}Al_yM_z)N$ are alternately laminated. Accordingly, the whole hard coating layer has an excellent adhesion strength and excellent wear resistance, and also has an excellent adhesion strength to the cBN substrate. The B layer of an outermost surface of the hard coating layer has high hardness (28 to 40 GPa in a nano-indentation test performed with a load set such that an indentation depth is not greater than 1/10 of the layer thickness of the B layer), and a plastic deformation work ratio $W_{plast}/(W_{plast}+W_{elast})$ is within a range of 0.35 to 0.50. Accordingly, even in strong intermittent cutting of alloy steel or the like in which an intermittent and impact high load acts on a cutting edge, the hard coating layer acts to relax the impact, and thus the coated tool exhibits excellent wear resistance for a long period of time with no generation of fractures or the like.

BRIEF DESCRIPTION OF THE DRAWINGS

FIG. 3(a) is a schematic plan view, and FIG. 3(b) is a schematic front view.

DETAILED DESCRIPTION OF THE INVENTION

Figure 1:
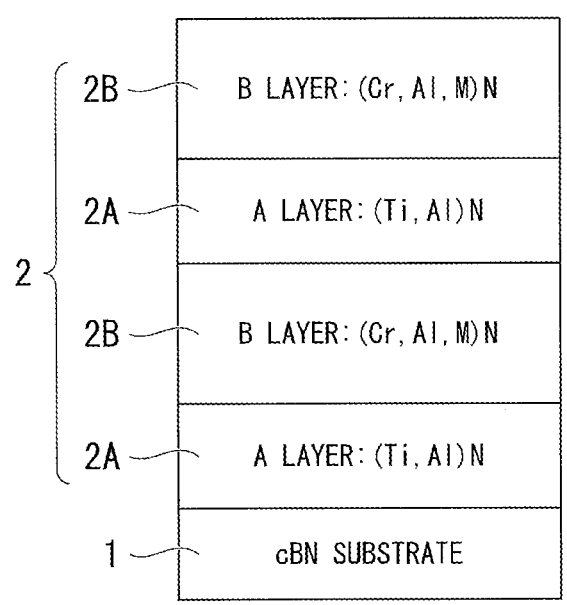
FIG. 1 is a schematic vertical cross-sectional view of a hard coating layer of a coated cBN tool according to an embodiment of the invention.

A coated cBN tool (surface-coated cubic boron nitride sintered material tool) according to an embodiment of the invention will be described in greater detail. As illustrated in FIG. 1, the coated cBN tool according to this embodiment is provided with a tool body 1 formed of a cBN sintered material, and a hard coating layer 2 covering a surface of the tool body 1. The hard coating layer 2 has an alternate laminated structure in which a layer 2A formed of (Ti, Al)N and a B layer 2B formed of (Cr, Al, M)N are alternately laminated.

Cubic Boron Nitride Sintered Material cBN Sintered Material

Since the component composition of the cBN sintered material constituting the body 1 of the coated cBN tool according to this embodiment is regulated within a specific range, the cBN sintered material exhibits an excellent adhesion strength to any one of the A layer 2A and the B layer 2B constituting the hard coating layer 2 having an alternate laminated structure to be described later. Particularly, since the adhesion strength to the A layer 2A is superior, the A layer 2A is preferable as a layer to be formed immediately on the cBN substrate (tool body) 1.

In this embodiment, the component composition of the cBN sintered material is determined as follows.
One or more of TiC, TiN, and TiCN: 10 to 50 vol %
WC: 0.1 to 2 vol %
AlN: 0.3 to 5 vol %
$TiB_2$: 2 to 10 vol %
$Al_2O_3$: 1.5 to 10 vol %
cBN (cubic boron nitride): 30 to 80 vol %

In this embodiment, the technical reason for determining the component composition of the cBN sintered material as described above is as follows.

cBN Grains

In general, cBN grains in a cutting edge act to secure wear resistance and plastic deformation resistance. However, in a case where the content of the grains in the binder phase (cBN content in the cBN sintered material) is less than 30 vol %, the high hardness of the cBN sintered material is not sufficiently exhibited, and thus the wear resistance is significantly reduced. It is not preferable that the content of the grains is greater than 80 vol % since toughness is reduced, and thus fractures are likely to occur. In addition, the adhesion between the cBN substrate 1 and the hard coating layer 2 deteriorates, and thus abnormal wear accompanied with peeling of the hard coating layer 2 occurs and the wear resistance is reduced.

Accordingly, the content of the cBN grains is determined to be 30 to 80 vol %, and more preferably 40 to 70 vol %.

The grain size of the cBN grains is not particularly limited. However, in a case where the average grain size of the cBN grains is greater than 5.0 μm, the contact area between the hard coating layer 2 and the cBN grains having low chemical affinity (adhesion) to the hard coating layer 2 increases. Accordingly, there is a tendency that the adhesion between the hard coating layer 2 and the cBN substrate 1 deteriorates, and thus abnormal wear accompanied with peeling of the hard coating layer 2 occurs and the wear resistance is reduced. In a case where the average grain size of the cBN grains is less than 1.0 μm, sufficient wear resistance cannot be exhibited. Accordingly, the average grain size of the cBN grains is preferably 1 to 5 μm, and more preferably 2 to 4 μm.

TiC, TiN, TiCN Ti-based compounds

Ti-based compounds such as TiC, TiN, and TiCN contained in the cBN sintered material act as a binder phase, and act to secure the heat resistance and the toughness of the cBN sintered material. However, in a case where the total content of TiC, TiN, and TiCN is less than 10 vol %, the toughness is significantly reduced, and the adhesion strength to the hard coating layer 2 is also reduced. In a case where the total content is greater than 50 vol %, the cBN amount is relatively reduced, and thus desired high hardness cannot be obtained, and the heat resistance is also significantly reduced.

Accordingly, the total content of these Ti-based compounds is determined to be 10 to 50 vol %.

The total content of these Ti-based compounds (TiC, TiN, TiCN) is preferably 20 to 40 vol %. In addition, the average grain size of these Ti-based compounds is preferably 1 μm or less, and more preferably 0.2 to 0.7 µm in consideration of dispersibility in the cBN sintered material.

WC, TiB$_2$, AlN, Al$_2$O$_3$ (dispersion components)

Dispersion components such as WC, TiB$_2$, AlN, and Al$_2$O$_3$ contained in the cBN sintered material are all components dispersed as hard dispersion phases in the binder phase formed of a Ti-based compound, and act to suppress the grain growth of the Ti-based compound. In a case where WC is less than 0.1 vol %, TiB$_2$ is less than 2 vol %, AlN is less than 0.3 vol %, and Al$_2$O$_3$ is less than 1.5 vol %, the effect of suppressing the grain growth of the Ti-based compound is small. In a case where WC is greater than 2 vol %, TiB$_2$ is greater than 10 vol %, AlN is greater than 5 vol %, and Al$_2$O$_3$ is greater than 10 vol %, the sinterability of the cBN sintered material is reduced, the strength is reduced, and the adhesion strength to the hard coating layer 2 is also reduced.

In addition to the above-described actions, in a case where TiB$_2$ is less than 2 vol %, the strength is significantly reduced at high temperatures, and in a case where TiB$_2$ is greater than 10 vol %, the strength and the toughness are significantly reduced even in a temperature region which is not so high. In addition, in a case where AlN is less than 0.3 vol %, the sintered material is not likely to be dense, and in a case where AlN is greater than 5 vol %, the strength and the toughness are significantly reduced. Moreover, in a case where Al$_2$O$_3$ is less than 1.5 vol %, the wear resistance and the heat resistance are significantly reduced, and in a case where Al$_2$O$_3$ is greater than 10 vol %, the toughness is significantly reduced.

Accordingly, a reduction in the sinterability and in the strength of the cBN sintered material can be suppressed by adjusting the content of each dispersion component in the cBN sintered material to the above-described specific amount. At the same time, since the effect of suppressing the grain growth of the Ti-based compound in the cBN sintered material can be exhibited and the dispersion of the cBN grains can be increased, the adhesion strength to the hard coating layer can be further improved.

Accordingly, the contents of the dispersion components are determined as follows: 0.1 to 2 vol % of WC; 2 to 10 vol % of TiB$_2$; 0.3 to 5 vol % of AlN; and 1.5 to 10 vol % of Al$_2$O$_3$.

The ranges of these dispersion components are preferably as follows: 0.3 to 1.5 vol % of WC; 3 to 7 vol % of TiB$_2$; 1 to 4 vol % of AlN; and 2 to 9 vol % of Al$_2$O$_3$.

The grain sizes of these dispersion components in the matrix are all preferably 0.5 µm or less, and preferably 0.3 µm or less in terms of average grain size. The lower limit value of the average grain size is preferably 0.1 µm.

In this embodiment, it is necessary to consider the dispersion states of the cBN grains and the binder phase in order to improve the adhesion strength between the cBN sintered material and the hard coating layer 2.

In general, the binder phase contributes to the adhesion strength between the tool body 1 and the hard coating layer 2 in the coated cBN tool. For example, in a cBN sintered material having a high content of cBN grains which is greater than 80 vol %, the content rate of the binder phase, that is, the surface area of the binder phase exposing to the body surface (surface of the tool body 1) is relatively reduced, and thus a sufficient adhesion strength cannot be obtained. In addition, even in a case where the content of cBN grains is not greater than 80 vol % as in this embodiment, in a state in which the binder phase is not uniformly dispersed as in a state in which cBN grains are in contact with each other, the binder phase is partially reduced. Accordingly, the surface area of the binder phase exposing to the body surface is reduced similarly, and thus a sufficient adhesion strength cannot be obtained.

Accordingly, in the cBN sintered material according to this embodiment, the following relationship has been found in order to improve the adhesion strength to the hard coating layer, and the relation has been applied.

That is, it has been found that in a case where the average grain size of the cBN grains of a raw material powder is represented by D (µm), and in a case where the total volume percentage (vol %) of cBN grains with a grain size of 3D (µm) or more existing in the sintered material satisfies 5 vol % or less in the measurement of the grain size of the cBN grains in the sintered material enlarged in appearance due to the contact or the like in ultra-high pressure sintering, the adhesion strength between the cBN sintered material and the hard coating layer 2 is improved.

Here, for example, in a case where the average grain size of the cBN grains of the raw material powder is 2 µm, 3D equals 6 µm, and in a case where the total volume percentage (vol %) of cBN grains with a grain size of 6 µm or more is 5 vol % or less in the sintered material, a sufficient adhesion strength is secured between the cBN sintered material and the hard coating layer 2. In addition, in order to exhibit such dispersibility of the cBN grains, the contents of the dispersion components described above are needed. Furthermore, using the average grain size of the cBN grains in the sintered material, whether the cBN grains are sufficiently dispersed in the sintered material (whether a sufficient adhesion strength is obtained) may be judged through observation using a scanning electron microscope (scanning electron microscopy: SEM) or the like. Similarly, it has been confirmed that in a case where the average grain size of the cBN grains in the sintered material is represented by D' (µm), and in a case where the total volume percentage (vol %) of cBN grains with a grain size of 3D' (µm) or more existing in the sintered material satisfies 5 vol % or less, the adhesion strength between the cBN sintered material and the hard coating layer 2 is improved.

The total volume percentage (vol %) of the cBN grains with a grain size of 3D (µm) or more or 3D' (µm) or more in the sintered material can be obtained in the same manner as in the measurement of the average grain sizes of the cBN grains, the Ti-based compounds, and the dispersion components to be described below.

The average grain sizes of the cBN grains, the Ti-based compounds (TiC, TiN, TiCN), and the dispersion components (WC, TiB$_2$, AlN, Al$_2$O$_3$) in the cBN sintered material can be measured and obtained by, for example, the following method.

Regarding the cBN grains, a cross-sectional structure (in the tool body 1, a structure of a cross section vertical to the surface of the tool body 1) of a produced cBN sintered material is observed by a scanning electron microscope (scanning electron microscopy: SEM), and a secondary electron image is obtained. In the obtained image, cBN grain portions are extracted by an image process, and a maximum length of each cBN grain is obtained by image analysis and defined as a diameter of each cBN grain. Based on the volumes of the respective cBN grains calculated and obtained from the diameters by assuming that the grains are spheres, a graph having a vertical axis representing a volume percentage (vol %) and a horizontal axis representing a diameter (µm) is drawn. Here, the volume percentage is a ratio of an integrated value of the volumes of the respective cBN grains with respect to the sum of the volumes of all the cBN grains. The integrated value of the volumes is the sum of the volumes of the respective cBN grains and the volumes of the cBN grains having a diameter which is not greater than the diameters of the above cBN grains. A diameter (median diameter) in which the volume percentage is 50 vol % is defined as a grain size of the cBN grains in the secondary electron image. The average of the values (grain sizes of the cBN grains in the respective secondary electron images) obtained by processing at least three secondary electron images obtained by SEM at a magnification of 5,000 times is defined as an average grain size (μm) of the cBN grains.

Regarding the grains of the Ti-based compounds and the dispersion components, a cross-sectional structure of a produced cBN sintered material is observed using Auger electron spectroscopy (AES) to observe each binder phase structure of the cBN sintered material, and elemental mapping images of the constituent elements are obtained. For example, elemental mapping images of Al and O are obtained in obtaining an average grain size of $Al_2O_3$. Overlapping portions of the obtained elemental mapping images are analyzed by image analysis, and grains of the Ti-based compounds and the dispersion components are extracted by an image process. A maximum length of each of the grains of the Ti-based compounds and the dispersion components is obtained by image analysis and defined as a diameter of each of the grains of the Ti-based compounds and the dispersion components. Similarly to the case of the cBN grains, based on the volumes of the respective grains calculated and obtained from the diameters, a graph having a vertical axis representing a volume percentage (vol %) and a horizontal axis representing a diameter (μm) is drawn. This graph is drawn individually for each of the Ti-based compounds and the dispersion components. A diameter (median diameter) in which the volume percentage obtained from each graph is 50 vol % is defined as a grain size of the grains of each of the Ti-based compounds and the dispersion components in the images obtained by AES. The average of the values (grain sizes of each of the Ti-based compounds and the dispersion components in the respective images) obtained by processing at least three elemental mapping images obtained by AES at a magnification of 20,000 times is defined as an average grain size (μm) of the grains of each of the Ti-based compounds and the dispersion components.

A layer Constituting Alternate Laminated Structure of Hard Coating Layer

FIG. 1 illustrates a schematic vertical cross-sectional view of the hard coating layer 2 of the coated tool according to this embodiment. The complex nitride layer of Ti and Al (hereinafter, may also be simply indicated by "(Ti, Al)N layer") itself constituting the A layer 2A of the hard coating layer 2 having an alternate laminated structure has an excellent high-temperature strength. In addition, the A layer 2A has an excellent adhesion strength to the cBN substrate 1, and also has an excellent adhesion strength to the B layer 2B constituting the alternate lamination. Therefore, by virtue of the formation of the hard coating layer 2 having an alternate laminated structure of A layer 2A and B layer 2B, the interlayer adhesion strength between the A layer and the B layer can be increased, and as a result, the fracture resistance and the peeling resistance can be improved with no reduction in the wear resistance.

However, in a case where the composition of (Ti, Al)N of the A layer 2A is represented by a composition formula $(Ti_{1-x}Al_x)N$, and in a case where x (atomic ratio) representing the content ratio of Al is less than 0.4, the high-temperature hardness is reduced, and this leads to a deterioration in the wear resistance. In addition, in a case where x (atomic ratio) is greater than 0.7, the content ratio of Ti is relatively reduced, and thus a sufficient high-temperature strength cannot be secured, and the hardness is reduced due to the appearance of crystal grains having a hexagonal structure. As a result, the wear resistance is reduced. Accordingly, x (atomic ratio) representing the content ratio of Al in the A layer 2A is determined to be 0.4 to 0.7. x (atomic ratio) representing the content ratio of Al in the A layer 2A is preferably 0.45 to 0.65.

B Layer Constituting Alternate Laminated Structure of Hard Coating Layer

In the complex nitride layer of Cr, Al, and M (hereinafter, may also be simply indicated by "(Cr, Al, M)N layer") constituting the B layer 2B, Cr which is a main component of the B layer 2B improves the high-temperature strength, thereby improving the fracture resistance of the hard coating layer 2. In addition, due to the Cr component and the Al component contained in a coexistent manner, the B layer 2B has high-temperature oxidation resistance in regard to high heat generated in high-speed cutting, and functions as a layer which reduces an intermittent and impact high load acting on the hard coating layer 2 in strong intermittent cutting.

However, in a case where the composition of (Cr, Al, M)N layer as the B layer 2B is represented by a composition formula $(Cr_{1-y-z}Al_yM_z)N$, and in a case where y (atomic ratio) representing the content ratio of Al is greater than 0.4, the hardness is increased, but lattice distortion increases, and thus the fracture resistance is reduced. In a case where y (atomic ratio) is less than 0.03, the wear resistance is reduced. Accordingly, y (atomic ratio) is 0.03 to 0.4. y (atomic ratio) is preferably 0.05 to 0.35.

In addition, the component M represents one or more elements selected from group 4a elements, group 5a elements, and group 6a elements in the periodic table excluding Cr, B, and Si. In a case where z (atomic ratio) representing the total content ratio of the component M is greater than 0.05, lattice distortion increases, and thus the fracture resistance is reduced. Accordingly, z (atomic ratio) is 0 to 0.05. z (atomic ratio) is preferably 0 to 0.04.

Specific examples of the component M include Zr, Ti, V, Nb, Mo, W, B, and Si. Among the components M, Zr acts to improve heat-resistant plastic deformability, Ti acts to improve high-temperature hardness, V acts to image lubricity, Nb acts to improve high-temperature wear resistance, Mo acts to improve welding resistance, W acts to improve heat radiation, B acts to increase film hardness and to improve lubricity, and Si acts to improve heat resistance. As described above, in a case where z (atomic ratio) representing the total content ratio of the component M is greater than 0.05, the fracture resistance of the B layer is reduced due to increasing lattice distortion. Accordingly, the upper limit of the total content ratio of the component M is 0.05.

Alternate Lamination of A Layer and B Layer

The average single layer thickness of each of the A layer 2A and the B layer 2B constituting the alternate laminated structure is 0.1 to 3.0 μm. Here, the average single layer thickness of the A layer 2A is an average of the layer thicknesses of the A layers 2A, and the average single layer thickness of the B layer 2B is an average of the layer thicknesses of the B layers 2B.

In a case where the average layer thickness of the A layers 2A is less than 0.1 µm, the effect of improving the adhesion strength to the tool body 1 or the B layer 2B is reduced. In a case where the average layer thickness of the A layers 2A is greater than 3.0 µm, cracks are likely to occur due to the accumulation of residual compressive stress, and thus no stable adhesion force can be secured. Therefore, the average single layer thickness of the A layer is determined to be 0.1 to 3.0 µm, and preferably 0.3 to 2.0 µm. More preferably, the layer thickness of each A layer 2A is within a range of 0.1 to 3.0 µm, but is not limited thereto.

In addition, in a case where the average layer thickness of the B layers 2B is less than 0.1 µm, excellent wear resistance cannot be exhibited for long-term use. In a case where the average layer thickness is greater than 3.0 µm, chipping or fracture is likely to occur. Therefore, the average layer thickness of the B layers is determined to be 0.1 to 3.0 µm, and preferably 0.3 to 2.0 µm. More preferably, the layer thickness of each B layer 2B is within a range of 0.1 to 3.0 µm, but is not limited thereto.

In addition, in a case where the total layer thickness of the hard coating layer 2 having an alternate laminated structure is less than 0.5 µm, sufficient wear resistance cannot be exhibited for a long period of time. In a case where the total layer thickness is greater than 4.0 µm, the hard coating layer 2 is likely to self-collapse. Therefore, the total layer thickness of the hard coating layer 2 is 0.5 to 4.0 µm.

In constituting the alternate laminated structure formed of A layer 2A and B layer 2B, by forming the A layer 2A immediately on the surface of the cBN substrate 1, the adhesion strength between the tool body 1 and the hard coating layer 2 can be further increased. In addition, by forming the B layer 2B on an outermost surface of the hard coating layer 2, an intermittent and impact high load acting during strong intermittent cutting can be effectively reduced, and thus the fracture resistance can be further improved. Accordingly, in constituting the alternate laminated structure, the A layer 2A is preferably formed immediately on the surface of the cBN substrate 1 and the B layer 2B is preferably formed on the outermost surface of the hard coating layer 2.

The compositions and the average single layer thicknesses of the A layer 2A and the B layer 2B, and the total layer thickness of the hard coating layer 2 can be measured by performing cross section measurement on a vertical section of the hard coating layer 2 vertical to the surface of the cBN substrate 1 using a scanning electron microscope (scanning electron microscopy: SEM), a transmission electron microscope (TEM), and energy dispersive X-ray spectroscopy (EDS).

Plastic Deformation Work Ratio $W_{plast}/(W_{plast}+W_{elast})$ of B Layer

In order to confirm the relaxation of a high load acting on a cutting edge during cutting by the B layer 2B of the hard coating layer 2 according to this embodiment, a nano-indentation test was performed with a load set such that an indentation depth is not greater than 1/10 of the layer thickness of the B layer 2B positioned on the outermost surface of the hard coating layer 2, and the hardness and the plastic deformation work ratio $W_{plast}/(W_{plast}+W_{elast})$ of the B layer 2B were obtained. The hardness (nano-indentation hardness) of the B layer 2B was confirmed to be within a range of 28 to 40 GPa, and the value of the plastic deformation work ratio $W_{plast}/(W_{plast}+W_{elast})$, was confirmed to be within a range of 0.35 to 0.50.

Figure 2A:
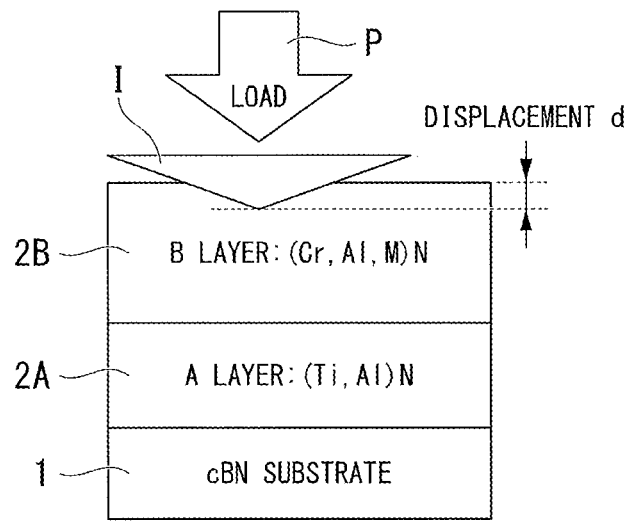
FIG. 2A is a schematic view for illustrating obtaining a plastic deformation work ratio, and for illustrating a test method.
Figure 2B:
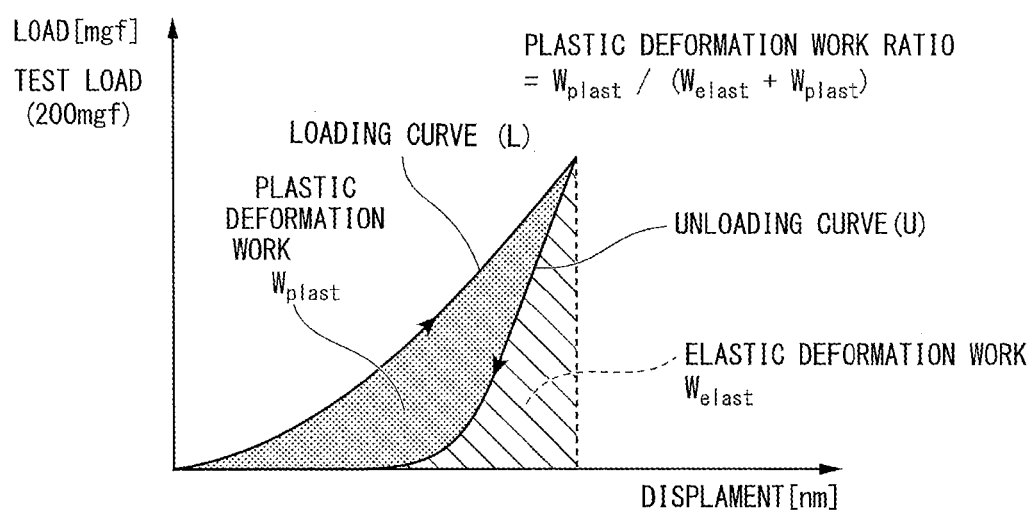
FIG. 2B is a schematic view for illustrating obtaining a plastic deformation work ratio, and for illustrating a displacement-load loading curve and a displacement-load unloading curve obtained by the test.

The plastic deformation work ratio $W_{plast}/(W_{plast}+W_{elast})$ is calculated as illustrated in the schematic views of FIGS. 2A and 2B. Specifically, an indenter I is disposed on a surface of the B layer which is an outermost surface of the hard coating layer 2, and a load P is applied to the indenter I such that an indentation depth is not greater than 1/10 of the layer thickness of the B layer 2B, thereby displacing the surface of the B layer 2B (see FIG. 2A). From a displacement d and the load P at that time, a displacement-load loading curve L is obtained (see FIG. 2B), and then the load P is removed to obtain a displacement-load unloading curve U (see FIG. 2B). Plastic deformation work $W_{plast}$ and elastic deformation work $W_{elast}$ are obtained from a difference between the loading curve L and the unloading curve U. Specifically, in the loading curve L and the unloading curve U drawn to have a vertical axis representing the load P (mgf) and a horizontal axis representing the displacement d (nm), the area of a region surrounded by the loading curve L, the unloading curve U, and the horizontal axis is the plastic deformation work $W_{plast}$, and the area of a region surrounded by the unloading curve U, the horizontal axis, and the line (dotted line in FIG. 2B) which intersects the horizontal axis and is parallel to the vertical axis at a maximum value of the displacement d is the elastic deformation work $W_{elast}$. From these values, the plastic deformation work ratio $W_{plast}/(W_{plast}+W_{elast})$ can be calculated.

In a case where the plastic deformation work ratio $W_{plast}/(W_{plast}+W_{elast})$ is within a range of 0.35 to 0.50, the B layer can have an impact relaxation property with no reduction in the plastic deformation resistance, and thus excellent fracture resistance is exhibited even under strong intermittent cutting conditions.

In a case where the plastic deformation work ratio $W_{plast}/(W_{plast}+W_{elast})$, is less than 0.35, a sufficient impact relaxation property is not obtained, and thus sufficient fracture resistance cannot be obtained under strong intermittent cutting high conditions. In a case where the plastic deformation work ratio is greater than 0.50, the plastic deformation resistance is reduced, and there is a tendency that the wear resistance is reduced. Accordingly, the plastic deformation work ratio $W_{plast}/(W_{plast}+W_{elast})$, is 0.35 to 0.50.

In a case where a bias voltage within a range of −10 to −75 V is applied to the tool body, and a predetermined electric current within a range of 100 to 200 A is allowed to flow between a cathode electrode (evaporation source) and an anode electrode for forming a B layer to generate arc discharge and to thus deposit a B layer 2B, a B layer 2B having the above-described plastic deformation work ratio is obtained.

Next, the coated cBN tool according to this embodiment will be described in detail with examples.

EXAMPLES

Production of cBN Substrate

As a raw material powder, a cBN powder having an average grain size within a range of 1 to 5 µm was prepared as a raw material powder for hard phase formation, and likewise, one or more of a TiC powder, a TiN powder, and a TiCN powder having an average grain size of 1 µm or less were prepared as a raw material powder for binder phase formation. Likewise, a WC powder, an MN powder, a $TiB_2$ powder, and an $Al_2O_3$ powder having an average grain size of 1 μm or less were prepared as a raw material powder for dispersion component formation.

The cBN powder, the raw material powder for binder phase formation, and the raw material powder for dispersion component formation were blended at a predetermined blending ratio.

Next, the raw material powders were wet-mixed for 72 hours by a ball mill and dried. Then, the mixture was subjected to press molding into dimensions of 50 mm in diameter and 1.5 mm in thickness at a molding pressure of 120 MPa to obtain a molded body. The molded body was held and temporarily sintered at a predetermined temperature of 900° C. to 1300° C. in a vacuum atmosphere with a pressure of $1 \times 10^{-4}$ Pa or less, and then set in an ultra-high pressure sintering apparatus and subjected to ultra-high pressure sintering under conditions of pressure: 5 GPa, temperature: 1200° C. to 1400° C., and 30 min of holding time. Accordingly, cBN sintered materials 1 to 12 according to this embodiment shown in Table 1 were produced.

Regarding the cBN sintered materials 1 to 12 produced as described above, vertical sections thereof were observed by the following method, and volume ratios and average grain sizes of cBN grains, binder phase components, and dispersion components were measured and calculated by the following method.

Measurement and Calculation of Volume Ratio

Regarding the content (volume %) of the cBN grains in the cBN sintered material, a cross-sectional structure of a produced cBN sintered material was observed by a scanning electron microscope (scanning electron microscopy: SEM). In the obtained secondary electron image, cBN grain portions were extracted by an image process, and an area occupied by the cBN grains was calculated by image analysis. The calculated value was divided by a total image area to calculate an area ratio. The area ratio was regarded as volume %, and the content (volume %) of the cBN grains in the secondary electron image was obtained. The average of the values (area ratios in the respective secondary electron images) obtained by processing at least three secondary electron images obtained by SEM at a magnification of 5,000 times was defined as a content (volume %:vol %) of the cBN grains. A visual field area of approximately 20 μm×20 μm is preferable as an observation region to be used in the image process. In this example, the content (volume ratio) of the cBN grains was obtained from three images in which three regions having a size of 20 μm×20 μm were observed.

Regarding the contents (volume %) of the binder phase components and the dispersion components in the cBN sintered material, a cross-sectional structure of a produced cBN sintered material was observed using Auger electron spectroscopy (AES) to observe each binder phase structure of the cBN sintered material, and elemental mapping images of the constituent elements of each binder phase structure were obtained. For example, in a case of $Al_2O_3$, elemental mapping images of Al and O were obtained. Overlapping portions of the obtained elemental mapping images were analyzed by image analysis, and grains of the binder phase components and the dispersion components were extracted by an image process. An area occupied by the grains of the binder phase component and an area occupied by the grains of the dispersion component were calculated by image analysis. The calculated values were divided by a total image area to calculate an area ratio of each of the binder phase components and the dispersion components. The area ratio was regarded as volume %, and the content (volume %) of the grains of each of the binder phase components and the dispersion components in the images obtained by AES was obtained. The average of the values (area ratios of the grains of each of the binder phase components and the dispersion components in the respective images) obtained by processing at least three elemental mapping images obtained by AES at a magnification of 20,000 times was defined as a content (volume %:vol %) of the grains of each of the binder phase components and the dispersion components. A visual field area of approximately 5 μm×5 μm is preferable as an observation region to be used in the image process. In this example, the content (volume ratio) of the grains of each of the binder phase components and the dispersion components was obtained from three images in which three regions having a size of 5 μm×5 μm were observed.

Measurement and Calculation of Average Grain Diameter

Regarding the average grain size of the cBN grains, a cross-sectional structure of a produced cBN sintered material was observed by a scanning electron microscope (scanning electron microscopy: SEM), and a secondary electron image was obtained. In the obtained image, cBN grain portions were extracted by an image process, and a maximum length of each cBN grain was obtained by image analysis and defined as a diameter of each cBN grain. Based on the volumes of the respective cBN grains calculated and obtained from the diameters by assuming that the cBN grains were spheres, a graph having a vertical axis representing a volume percentage (vol %) and a horizontal axis representing a diameter (μm) was drawn. A diameter in which the volume percentage was 50 vol % was defined as a grain size of the cBN grains in the secondary electron image. The average of the values obtained by processing at least three secondary electron images obtained by SEM at a magnification of 5,000 times was defined as an average grain size (μm) of the cBN grains. In this example, the average grain size of the cBN grains was obtained from three images in which three regions having a size of 20 μm×20 μm were observed.

Regarding the average grain sizes of the grains of the Ti-based compounds (binder phase components) and the dispersion components, a cross-sectional structure of a produced cBN sintered material was observed using Auger electron spectroscopy (AES) to observe each binder phase structure of the cBN sintered material, and elemental mapping images of the constituent elements were obtained. For example, in a case of $Al_2O_3$, elemental mapping images of Al and O were obtained. Overlapping portions of the obtained elemental mapping images were analyzed by image analysis, and grains of the Ti-based compounds and the dispersion components were extracted by an image process. A maximum length of each of the grains of the Ti-based compounds and the dispersion components was obtained by image analysis and defined as a diameter of each of the grains of the Ti-based compounds and the dispersion components. Similarly to the case of the cBN grains, based on the volumes of the respective grains calculated and obtained from the diameters, a graph having a vertical axis representing a volume percentage (vol %) and a horizontal axis representing a diameter (μm) was drawn. This graph was drawn individually for each of the Ti-based compounds and the dispersion components. A diameter in which the volume percentage was 50 vol % was defined as a grain size of the grains of each of the Ti-based compounds and the dispersion components in the images obtained by AES. The average of the values obtained by processing at least three elemental mapping images obtained by AES at a magnification of 20,000 times was defined as an average grain size (µm) of the grains of each of the Ti-based compounds and the dispersion components. In this example, the average grain size of the grains of each of the binder phase components and the dispersion components was obtained from three images in which three regions having a size of 5 µm×5 µm were observed.

Table 1 shows the values of the volume ratios and the average grain sizes of the cBN grains, the binder phase components, and the dispersion components obtained in regard to the cBN sintered materials 1 to 12.

Dispersibility of cBN Grains

Table 1 shows results of the dispersibility evaluation of the cBN grains in the cBN sintered materials 1 to 12. Regarding each of the cBN sintered materials 1 to 12, a volume ratio (total volume percentage) of the cBN grains having a grain size three times (3D) or more an average grain size D (µm) of the cBN grains of the raw material powder in the cBN sintered material was calculated in the same manner as in the above-described method of calculating the average grain size and the volume ratio of the cBN grains. Specifically, a cross-sectional structure of each of the cBN sintered materials 1 to 12 was observed by SEM. In the obtained secondary electron image, cBN grain portions were extracted by an image process, and a maximum length of each cBN grain was obtained by image analysis and defined as a diameter of each cBN grain. A total of the areas of the cBN grains having a diameter of 3D or more was divided by a total area of the secondary electron image to calculate an area ratio. This area ratio was defined as a volume ratio (total volume percentage). In a case where the volume ratio is less than 5 vol %, the dispersibility of the cBN grains was judged to be excellent and indicated by "A" in the table. In a case where the volume ratio was 5 vol % or more, the dispersibility of the cBN grains was judged to deteriorate and indicated by "B" in the table.

In addition, in a case where the average grain size of the cBN grains of the cBN sintered materials 1 to 12 was represented by D', a volume ratio (total volume percentage) of the cBN grains having a diameter of 3D' or more in each cBN sintered material was also calculated in the same manner as in the above description. In a case where the volume ratio is less than 5 vol %, the dispersibility of the cBN grains was judged to be excellent and indicated by "A" in the table. In a case where the volume ratio was 5 vol % or more, the dispersibility of the cBN grains was judged to deteriorate and indicated by "B" in the table.

Each of the cBN sintered materials 1 to 12 was cut into predetermined dimensions by a wire-electrical discharge machine and brazed to a brazing portion (corner portion) of an insert body made of WC-based cemented carbide having a composition including 5 mass % of Co, 5 mass % of TaC, and the balance WC and having an insert shape of ISO-standards CNGA120408 by using an Ag alloy-based brazing material having a composition including 25 mass % of Cu, 5 mass % of Ti, and the balance Ag in terms of mass %. By performing polishing on upper and lower surfaces and on an outer periphery, and performing a honing treatment, cBN bodies 1 to 12 according to this embodiment having an insert shape of ISO-standards CNGA120408 were manufactured.

Formation of Hard Coating Layer

Figure 3:
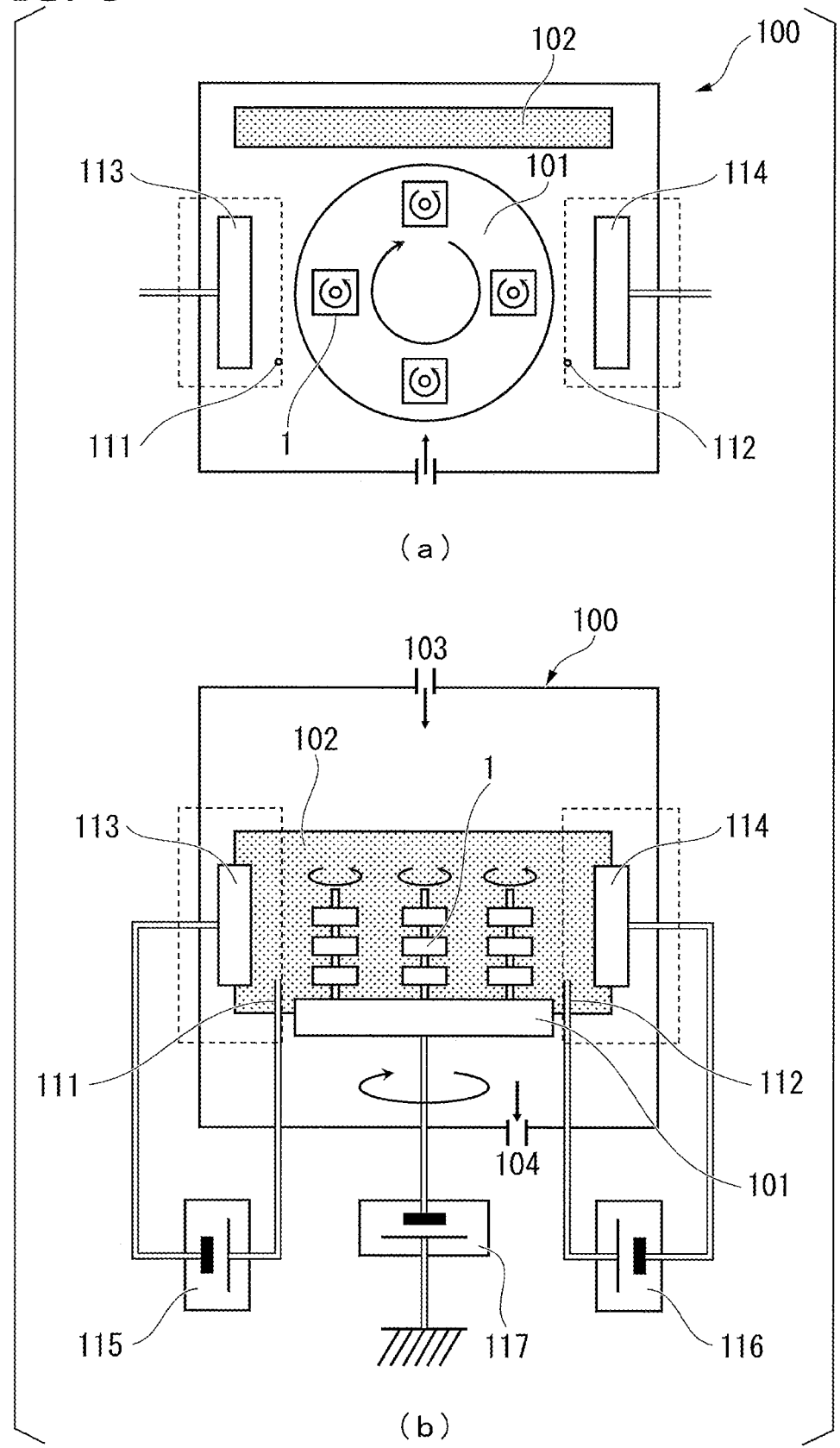
FIGS. 3(a) and 3(b) illustrate an arc ion plating apparatus which is used to form a hard coating layer.

A hard coating layer was formed on each of the cBN bodies 1 to 12 according to this embodiment using an arc ion plating apparatus 100 illustrated in FIGS. 3(a) and 3(b). The arc ion plating apparatus 100 is provided with a rotation table 101 for placing tool bodies 1 (cBN bodies 1 to 12), a heater 102 for heating the tool bodies 1, a reaction gas inlet 103 for introducing a reaction gas, an exhaust gas outlet 104 for discharging the gas to the outside of the system, two anode electrodes 111 and 112, and two cathode electrodes 113 and 114. The anode electrode 111 and the cathode electrode 113 are connected to an arc electric power supply 115 disposed outside the apparatus 100, the anode electrode 112 and the cathode electrode 114 are connected to an arc electric power supply 116 disposed outside the apparatus 100, and the rotation table 101 is connected to a bias electric power supply 117 disposed outside the apparatus 100. In this example, a target formed of a Ti—Al alloy having a composition shown in Table 2 was used as the cathode electrode 113 (evaporation source), and a target formed of a Cr—Al—M alloy having a composition shown in Table 2 was used as the cathode electrode 114 (evaporation source). Using such an arc ion plating apparatus 100, a hard coating layer was formed on a body surface of each of the cBN bodies 1 to 12 in accordance with the following procedures.

(a) The tool bodies 1 (cBN bodies 1 to 12) were subjected to ultrasonic cleaning in acetone. In a state of being dried, the tool bodies were mounted along the outer peripheral portion of the rotation table 101 at positions separated by a predetermined distance from a rotation central axis on the rotation table 101 in the arc ion plating apparatus 100 in a radial direction, respectively.

(b) First, while the apparatus 100 was evacuated to be held in vacuum of $10^{-2}$ Pa or less, the heater 102 heated the inside of the apparatus 100 to 450° C. or higher. After that, the inside of the apparatus 100 was set to be in an Ar gas atmosphere of 0.5 to 2.0 Pa, a direct current bias voltage of −200 to −1,000 V (more specifically, −250 V) was applied to the tool bodies 1 revolving and rotating on the rotation table 101, and surfaces of the tool bodies 1 (cBN bodies 1 to 12) were subjected to a bombardment treatment for 10 to 60 minutes (more specifically, 30 to 60 minutes) by argon ions.

(c) Next, a hard coating layer having an alternate laminated structure was formed as follows.

c-1 Formation of a Layer

First, a nitrogen gas as a reaction gas was introduced into the apparatus 100 to provide a predetermined reaction atmosphere with a pressure of 2 to 10 Pa shown in Table 2, and the temperature in the apparatus 100 was maintained at a temperature shown in Table 2. Likewise, the rotation speed of the rotation table 101 was controlled to be a rotation speed shown in Table 2, a predetermined direct current bias voltage of −10 to −75 V shown in Table 2 was applied to the tool bodies 1 (cBN bodies 1 to 12) revolving and rotating on the rotation table 101, and a predetermined current of 100 to 200 A shown in Table 2 was allowed to flow between the cathode electrode (evaporation source) 113 and the anode electrode 111 for forming an A layer to generate arc discharge. Accordingly, an A layer was formed.

c-2 Formation of B Layer

Next, a pressure of the nitrogen gas in the apparatus 100 was set to a value shown in Table 2, and a predetermined current of 100 to 200 A shown in Table 2 was allowed to flow between the cathode electrode (evaporation source) 114 and the anode electrode 112 for forming a B layer to generate arc discharge. Accordingly, a B layer was formed.

c-3 Formation of Alternate Laminated Structure

The steps (c-1) and (c-2) were performed once, respectively, or repeatedly performed multiple times to deposit, on each of the surfaces of the tool bodies 1 (cBN bodies 1 to 12), a hard coating layer having an alternate laminated structure of A layer and B layer with a target composition and a one-layer target average layer thickness shown in Table 3. The hard coating layer was formed such that the A layer was positioned on a surface of the tool body 1, and the B layer was positioned on an outermost surface of the hard coating layer. In this manner, invention coated cBN tools (hereinafter, referred to as "Tools of Examples of the present invention") 1 to 12 shown in Table 3 were produced.

For comparison, cBN grains having a predetermined average grain size, a raw material powder for forming a binder phase component, and a raw material powder for forming a dispersion component were blended at a predetermined blending ratio, and the mixture was sintered in the same manner as in the examples (Tools of Examples of the present invention) to produce cBN sintered materials 21 to 32 of comparative examples shown in Table 4. These were further processed in the same manner as in the examples (Tools of Examples of the present invention), and thus cBN bodies 21 to 38 of the comparative examples were produced.

A hard coating layer having an alternate laminated structure of A layer and B layer was deposited on each of the cBN bodies 21 to 38 of the comparative examples under conditions shown in Table 5 in accordance with the same procedures as in the case of the Tools of Examples of the present invention, and thus comparative example coated cBN tools (referred to as "Tools of Comparative Examples") 21 to 38 shown in Table 6 were produced.

Regarding the Tools of Examples of the present invention 1 to 12 and the Tools of Comparative Examples 21 to 38 produced as described above, cross section measurement was performed on a vertical section (cross section vertical to the surface of the tool body 1) of the hard coating layer using a scanning electron microscope (SEM), a transmission electron microscope (TEM), and energy dispersive X-ray spectroscopy (EDS) to measure the compositions and the one-layer thicknesses of the A layer and the B layer at plural places, and the measured values were averaged to calculate the compositions and the average single layer thicknesses.

Specifically, the composition was measured as follows. That is, a region of 5 μm×5 μm observed by SEM was subjected to line analysis by EDS. In each layer constituting the alternate laminated structure, 5 μm-line analysis was performed at 5 places at intervals of 1 μm in a direction vertical to the surface of the tool body. Accordingly, x or y and z of each measurement place were obtained. The obtained x's, y's, and z's were averaged respectively. The obtained values are shown in Tables 3 and 6 as compositions of the A layer and the B layer.

The average single layer thickness was measured as follows. That is, a boundary between the A layer and the B layer or between the A layer and the surface of the tool body was determined by an elemental mapping image obtained by plane analysis of EDS in a region of 5 μm×5 μm observed by SEM. In addition, regarding the layers constituting the alternate laminated structure, an interval between the boundaries of the layers in a direction vertical to the surface of the tool body was measured. In the layers, the interval was measured at 5 places at intervals of 1 μm in a direction parallel to the surface of the tool body. Regarding the A layer and the B layer, the measured intervals were averaged. The obtained values are shown in Tables 3 and 6 as average single layer thicknesses of the A layer and the B layer.

The hardness of the B layer as an outermost surface layer of each of the Tools of Examples of the present invention 1 to 12 and the Tools of Comparative Examples 21 to 38 was obtained.

As the hardness of the B layer of the outermost surface, nano-indentation hardness was obtained by a nano-indentation method. The results are shown in Tables 3 and 6.

A nano-indentation test was performed on the B layer as an outermost surface layer of each of the Tools of Examples of the present invention 1 to 12 and the Tools of Comparative Examples 21 to 38 to calculate a plastic deformation work ratio $W_{plast}/(W_{plast}+W_{elast})$ from a displacement-load loading curve and a displacement-load unloading curve.

More specifically, using a Berkovich indenter (dihedral angle: 115° C.) made of diamond, a nano-indentation test was performed with a load of 200 mg at an indentation depth of not greater than 1/10 of the layer thickness of the B layer (see FIG. 2A). Accordingly, the surface of the B layer was displaced, and a displacement-load loading curve and a displacement-load unloading curve were obtained (see FIG. 2B). Plastic deformation work ratio $W_{plast}$ and elastic deformation work $W_{elast}$ were obtained from a difference (area) between the displacement-load loading curve and the displacement-load unloading curve, and using these values, a plastic deformation work ratio $W_{plast}/(W_{plast}+W_{elast})$ was calculated. The nano-indentation test was performed at 5 places in each tool. The average of the obtained plastic deformation work ratios is shown in Tables 3 and 6 as a plastic deformation work ratio.

FIG. 2B illustrates a schematic view illustrating a displacement-load loading curve L and a displacement-load unloading curve U measured in regard to the B layer as an outermost surface layer of the hard coating layer of the invention tool 1. A test load P is determined depending on the layer thickness of the tool such that the indentation depth is not greater than 1/10 of the layer thickness of the B layer even in a sample in which the layer thickness of the B layer of the outermost surface is the smallest among samples measured at the same time. Regarding the measurement results shown in FIG. 2B, it was confirmed that the test was performed with a test load of 200 mg and the indentation depth was not greater than 1/10 of the layer thickness of the B layer.

Tables 3 and 6 show the various values obtained as described above. In Table 6, "–" is displayed in the fields of the items related to the B layer in regard to the Tools of Comparative Examples having no B layer therein.

TABLE 1

| Type of Sintered Material | Component Composition (vol %) and Average Grain Size (μm) | | | | | | | | | | | | | | | | cBN Dispersibility 3D <5 vol % | cBN Dispersibility 3D' <5 vol % |
|---|---|---|---|---|---|---|---|---|---|---|---|---|---|---|---|---|---|---|
| | TiC | | TiN | | TiCN | | WC | | AlN | | TiB₂ | | Al₂O₃ | | cBN | | | |
| | vol % | μm | vol % | μm | vol % | μm | vol % | μm | vol % | μm | vol % | μm | vol % | μm | vol % | μm | | |
| 1 | — | — | 39.7 | 0.2 | — | — | 0.5 | 0.3 | 1.2 | 0.2 | 4.8 | 0.3 | 3.6 | 0.2 | 50.2 | 2.5 | A | A' |
| 2 | — | — | 15.0 | 0.3 | — | — | 0.3 | 0.3 | 3.6 | 0.1 | 3.5 | 0.2 | 2.5 | 0.2 | 75.1 | 3.0 | A | A' |
| 3 | — | — | 24.5 | 0.5 | — | — | 0.4 | 0.3 | 2.0 | 0.4 | 4.0 | 0.5 | 7.5 | 0.4 | 61.6 | 1.5 | A | A' |
| 4 | — | — | 33.6 | 1.0 | 12.6 | 1.0 | 1.0 | 0.2 | 1.0 | 0.5 | 6.6 | 0.4 | 6.9 | 0.3 | 38.3 | 1.6 | A | A' |
| 5 | — | — | 19.0 | 0.7 | 8.8 | 0.7 | 1.6 | 0.1 | 1.5 | 0.3 | 5.3 | 0.3 | 8.8 | 0.4 | 55.0 | 1.0 | A | A' |
| 6 | 45.3 | 0.8 | — | — | — | — | 1.8 | 0.3 | 4.6 | 0.2 | 2.3 | 0.3 | 1.7 | 0.1 | 44.3 | 4.6 | A | A' |
| 7 | 10.8 | 0.6 | 9.6 | 0.6 | — | — | 0.8 | 0.4 | 2.7 | 0.4 | 3.8 | 0.2 | 4.6 | 0.2 | 67.7 | 1.2 | A | A' |
| 8 | — | — | — | — | 28.4 | 0.5 | 0.6 | 0.4 | 0.8 | 0.3 | 8.5 | 0.4 | 3.3 | 0.3 | 58.4 | 2.2 | A | A' |
| 9 | — | — | 37.0 | 0.4 | — | — | 1.2 | 0.3 | 2.1 | 0.2 | 5.7 | 0.4 | 5.3 | 0.3 | 48.7 | 4.3 | A | A' |
| 10 | 32.8 | 0.4 | — | — | — | — | 0.7 | 0.5 | 1.8 | 0.5 | 4.1 | 0.3 | 4.4 | 0.4 | 56.2 | 2.7 | A | A' |
| 11 | 20.7 | 0.3 | — | — | 27.4 | 0.3 | 1.5 | 0.2 | 2.7 | 0.1 | 7.2 | 0.5 | 3.1 | 0.5 | 37.4 | 3.2 | A | A' |
| 12 | — | — | 21.4 | 0.8 | — | — | 0.2 | 0.2 | 3.2 | 0.3 | 2.0 | 0.2 | 2.3 | 0.3 | 70.9 | 2.0 | A | A' |

TABLE 2

| Type | Type of Sintered Material | Type of Cathode Electrode (target) For Forming A layer | Type of Cathode Electrode (target) For Forming B layer | Deposition Conditions Temperature in Apparatus (° C.) | Rotation Speed of Rotation Table (rpm) | Deposition Conditions in Formation of A layer Pressure of N₂ Gas (Pa) | Deposition Conditions in Formation of A layer Direct Current Bias Voltage (V) | Deposition Conditions in Formation of A layer Arc Current (A) | Deposition Conditions in Formation of B layer Pressure of N₂ Gas (Pa) | Deposition Conditions in Formation of B layer Direct Current Bias Voltage (V) | Deposition Conditions in Formation of B layer Arc Current (A) |
|---|---|---|---|---|---|---|---|---|---|---|---|
| Tools of Examples of the present invention | 1 | Al0.60 Ti0.40 | Cr0.70 Al0.30 | 500 | 2.0 | 6.0 | −30 | 150 | 6.0 | −30 | 120 |
| | 2 | Al0.60 Ti0.40 | Cr0.67 Al0.30 Si0.03 | 450 | 2.5 | 2.5 | −40 | 180 | 4.0 | −50 | 140 |
| | 3 | Al0.50 Ti0.50 | Cr0.85 Al0.10 B0.05 | 500 | 1.5 | 2.0 | −50 | 120 | 8.0 | −25 | 180 |
| | 4 | Al0.70 Ti0.30 | Cr0.60 Al0.40 | 550 | 2.0 | 10.0 | −75 | 200 | 10.0 | −20 | 150 |
| | 5 | Al0.55 Ti0.45 | Cr0.75 Al0.25 | 400 | 3.0 | 8.0 | −25 | 150 | 6.0 | −30 | 150 |
| | 6 | Al0.45 Ti0.55 | Cr0.90 Al0.05 V0.05 | 500 | 2.0 | 4.0 | −50 | 150 | 8.0 | −10 | 200 |
| | 7 | Al0.50 Ti0.50 | Cr0.80 Al0.20 | 450 | 2.0 | 6.0 | −40 | 120 | 4.0 | −40 | 150 |
| | 8 | Al0.45 Ti0.55 | Cr0.69 Al0.30 Zr0.01 | 500 | 2.5 | 4.0 | −30 | 140 | 4.0 | −55 | 120 |
| | 9 | Al0.60 Ti0.40 | Cr0.77 Al0.20 Nb0.03 | 550 | 2.0 | 8.0 | −30 | 150 | 6.0 | −30 | 100 |
| | 10 | Al0.55 Ti0.45 | Cr0.60 Al0.40 | 500 | 2.0 | 2.5 | −50 | 180 | 2.5 | −75 | 150 |
| | 11 | Al0.50 Ti0.50 | Cr0.70 Al0.30 | 500 | 2.0 | 4.0 | −40 | 170 | 8.0 | −30 | 140 |
| | 12 | Al0.45 Ti0.55 | Cr0.59 Al0.40 W0.01 | 550 | 2.5 | 6.0 | −10 | 150 | 6.0 | −40 | 180 |

TABLE 3

| Type | Type of Sintered Material | A layer Layer Composition (x) | A layer Average single layer thickness (μm) | B layer Kind of Component M | B layer Layer Composition (y) | B layer Layer Composition (z) | B layer Average single layer thickness (μm) | Hardness of B layer (GPa) | Plastic Deformation Work Ratio of B layer | Total Layer Thickness (μm) |
|---|---|---|---|---|---|---|---|---|---|---|
| Tools of Examples of the present invention | 1 | 0.58 | 0.5 | — | 0.28 | 0.00 | 1.5 | 35 | 0.40 | 2.0 |
| | 2 | 0.58 | 0.5 | Si | 0.29 | 0.03 | 1.3 | 37 | 0.37 | 1.8 |
| | 3 | 0.48 | 0.4 | B | 0.09 | 0.05 | 0.5 | 31 | 0.45 | 2.7 |
| | 4 | 0.67 | 0.8 | — | 0.38 | 0.00 | 0.4 | 38 | 0.36 | 2.4 |
| | 5 | 0.52 | 0.4 | — | 0.23 | 0.00 | 0.4 | 34 | 0.42 | 3.2 |
| | 6 | 0.42 | 0.5 | V | 0.04 | 0.05 | 2.0 | 29 | 0.48 | 2.5 |
| | 7 | 0.47 | 1.5 | — | 0.19 | 0.00 | 0.7 | 32 | 0.44 | 2.2 |
| | 8 | 0.43 | 0.6 | Zr | 0.28 | 0.01 | 0.6 | 36 | 0.39 | 2.4 |
| | 9 | 0.57 | 0.5 | Nb | 0.18 | 0.03 | 0.5 | 34 | 0.41 | 2.0 |
| | 10 | 0.52 | 1.0 | — | 0.38 | 0.00 | 0.5 | 38 | 0.37 | 1.5 |
| | 11 | 0.48 | 0.8 | — | 0.28 | 0.00 | 1.0 | 35 | 0.39 | 3.6 |
| | 12 | 0.43 | 2.0 | W | 0.38 | 0.01 | 0.8 | 39 | 0.35 | 2.8 |

TABLE 4

| Type of Sintered Material | Component Composition (vol %) and Average Grain Size (μm) | | | | | | | | | | | | | | cBN Dispersibility 3D <5 vol % | cBN Dispersibility 3D' <5 vol % |
|---|---|---|---|---|---|---|---|---|---|---|---|---|---|---|---|---|
| | TiC vol % | μm | TiN vol % | μm | TiCN vol % | μm | WC vol % | μm | AlN vol % | μm | TiB$_2$ vol % | μm | Al$_2$O$_3$ vol % | μm | cBN vol % | μm | | |
| 21 | — | — | 36.7 | 0.4 | — | — | 1.2 | 0.3 | 1.9 | 0.2 | 5.2 | 0.4 | 4.5 | 0.2 | 50.5 | 2.2 | A | A' |
| 22 | — | — | 15.2 | 0.3 | — | — | 1.5 | 0.3 | 3.2 | 0.4 | 4.3 | 0.3 | 3.2 | 0.5 | 72.6 | 2.8 | A | A' |
| 23 | — | — | — | — | 23.5 | 0.5 | 0.8 | 0.4 | 2.4 | 0.4 | 3.7 | 0.4 | 6.8 | 0.3 | 62.8 | 1.4 | A | A' |
| 24 | — | — | 24.7 | 0.7 | 15.7 | 0.7 | 0.6 | 0.4 | 1.3 | 0.3 | 8.1 | 0.5 | 7.7 | 0.4 | 41.9 | 1.2 | A | A' |
| 25 | — | — | *52.0 | 0.9 | — | — | 0.3 | 0.5 | 3.8 | 0.5 | *11.3 | 0.3 | 5.3 | 0.5 | *27.3 | 3.8 | A | A' |
| 26 | 27.1 | 0.6 | — | — | — | — | 1.4 | 0.3 | *5.8 | 0.3 | 6.9 | 0.3 | *1.2 | 0.2 | 57.6 | 3.3 | B | B' |
| 27 | — | — | — | — | *9.6 | 0.3 | 1.8 | 0.2 | 0.8 | 0.1 | 2.9 | 0.2 | 1.9 | 0.1 | *83.0 | 4.5 | B | B' |
| 28 | 22.2 | 0.5 | — | — | — | — | *0.0 | 0.0 | 4.7 | 0.5 | 3.1 | 0.6 | 3.6 | 0.5 | 66.4 | 6.0 | B | B' |
| 29 | *54.7 | 1.5 | — | — | — | — | 1.8 | 0.1 | 2.8 | 0.3 | 7.4 | 0.3 | 5.6 | 0.3 | *27.7 | 0.7 | A | A' |
| 30 | — | — | 10.9 | 0.8 | 22.9 | 0.8 | 1.2 | 0.4 | *0.1 | 0.5 | 5.9 | 0.4 | *10.8 | 0.3 | 48.2 | 1.9 | B | B' |
| 31 | — | — | 23.4 | 0.5 | — | — | 0.7 | 0.7 | 3.8 | 0.2 | *1.8 | 0.3 | 2.2 | 0.4 | 68.1 | 2.5 | B | B' |
| 32 | 26.8 | 0.8 | — | — | — | — | *2.4 | 0.5 | 4.2 | 0.7 | 4.8 | 0.5 | 6.3 | 0.8 | 55.5 | 3.5 | A | A' |

*represents a feature out of this embodiment.

TABLE 5

| | | | | | Deposition Conditions | | | | | | |
|---|---|---|---|---|---|---|---|---|---|---|---|
| | | | | | | | Deposition Conditions in Formation of A layer | | | Deposition Conditions in Formation of B layer | | |
| Type | Type | Type of Sintered Material | Type of Cathode Electrode (target) For Forming A layer | For Forming B layer | Temperature in Apparatus (°C.) | Rotation Speed of Rotation Table (rpm) | Pressure of N$_2$ Gas (Pa) | Direct Current Bias Voltage (V) | Arc Current (A) | Pressure of N$_2$ Gas (Pa) | Direct Current Bias Voltage (V) | Arc Current (A) |
| Tools of Comparative Examples | 21 | 21 | *Al0.35 Ti0.65 | Cr0.60 Al0.40 | 450 | 2.5 | 4.0 | −50 | 150 | 4.0 | −55 | 120 |
| | 22 | 22 | Al0.50 Ti0.50 | *Cr0.95 Si0.05 | 550 | 2.0 | 8.0 | −50 | 120 | 8.0 | −25 | 180 |
| | 23 | 23 | *— | Cr0.70 Al0.30 | 450 | 2.0 | *— | *— | *— | 6.0 | −30 | 150 |
| | 24 | 24 | Al0.60 Ti0.40 | *— | 500 | 1.5 | 6.0 | −30 | 180 | *— | *— | *— |
| | 25 | 21 | *Al0.75 Ti0.25 | Cr0.60 Al0.40 | 500 | 3.0 | 10.0 | −20 | 120 | 4.0 | −50 | 200 |
| | 26 | 22 | Al0.55 Ti0.45 | *Cr0.55 Al0.45 | 550 | 2.0 | 8.0 | −30 | 140 | 2.5 | −40 | 150 |
| | 27 | 23 | Al0.50 Ti0.50 | *Cr0.62 Al0.30 Si0.08 | 500 | 2.5 | 6.0 | −40 | 160 | 4.0 | −30 | 180 |
| | 28 | 24 | Al0.50 Ti0.50 | Cr0.85 Al0.10 B0.05 | 500 | 2.0 | 2.5 | −75 | 200 | 6.0 | −20 | 150 |
| | 29 | 21 | Al0.45 Ti0.55 | Cr0.75 Al0.25 | 450 | 2.0 | 8.0 | −40 | 150 | 8.0 | −75 | 140 |
| | 30 | 22 | Al0.60 Ti0.40 | Cr0.80 Al0.20 | 450 | 1.5 | 4.0 | −50 | 180 | 4.0 | −10 | 160 |
| | 31 | 25 | Al0.60 Ti0.40 | Cr0.70 Al0.30 | 500 | 2.0 | 6.0 | −30 | 150 | 6.0 | −30 | 120 |
| | 32 | 26 | Al0.60 Ti0.40 | Cr0.67 Al0.30 Nb0.03 | 450 | 2.5 | 2.5 | −40 | 180 | 4.0 | −50 | 140 |
| | 33 | 27 | Al0.50 Ti0.50 | Cr0.85 Al0.10 B0.05 | 500 | 1.5 | 2.0 | −50 | 120 | 8.0 | −25 | 180 |
| | 34 | 28 | Al0.70 Ti0.30 | Cr0.60 Al0.40 | 550 | 2.0 | 10.0 | −75 | 200 | 10.0 | −20 | 150 |
| | 35 | 29 | Al0.45 Ti0.55 | Cr0.90 Al0.05 V0.05 | 500 | 2.0 | 4.0 | −50 | 150 | 8.0 | −10 | 200 |
| | 36 | 30 | Al0.45 Ti0.55 | Cr0.69 Al0.30 Zr0.01 | 500 | 2.5 | 4.0 | −30 | 140 | 4.0 | −55 | 120 |
| | 37 | 31 | Al0.55 Ti0.45 | Cr0.60 Al0.40 | 500 | 2.0 | 2.5 | −50 | 180 | 2.5 | −75 | 150 |
| | 38 | 32 | Al0.45 Ti0.55 | Cr0.59 Al0.40 W0.01 | 550 | 2.5 | 6.0 | −10 | 150 | 6.0 | −40 | 180 |

*represents a feature out of this embodiment.

TABLE 6

| | | | Hard Coating Layer Having Alternate Laminated Structure | | | | | | | |
|---|---|---|---|---|---|---|---|---|---|---|
| | | | A layer | | B layer | | | | | |
| Type | | Type of Sintered Material | Layer Composition (x) | Average single layer thickness (μm) | Kind of Component M | Layer Composition (y) | Layer Composition (z) | Average single layer thickness (μm) | Hardness of B layer (GPa) | Plastic Deformation Work Ratio of B layer | Total Layer Thickness (μm) |
| Tools of Comparative Examples | 21 | 21 | *0.32 | 0.5 | — | 0.38 | 0.00 | 1.5 | 32 | 0.37 | 2.0 |
| | 22 | 22 | 0.48 | 0.4 | Si | *0.00 | 0.04 | 0.7 | *26 | *0.52 | 3.3 |
| | 23 | 23 | *— | *— | — | 0.28 | 0.00 | 3.0 | 29 | 0.45 | 3.0 |
| | 24 | 24 | 0.59 | 2.5 | — | *— | *— | *— | *— | *— | 2.5 |
| | 25 | 21 | *0.72 | 1.0 | — | 0.38 | 0.00 | 2.0 | 38 | 0.36 | 3.0 |

TABLE 6-continued

| | | A layer | | | B layer | | | | | | |
|---|---|---|---|---|---|---|---|---|---|---|---|
| Type | Type of Sintered Material | Layer Composition (x) | Average single layer thickness (μm) | Kind of Component M | Layer Composition (y) | Layer Composition (z) | Average single layer thickness (μm) | Hardness of B layer (GPa) | Plastic Deformation Work Ratio of B layer | Total Layer Thickness (μm) |
| 26 | 22 | 0.53 | 0.8 | — | *0.42 | 0.00 | 0.6 | *42 | *0.29 | 2.8 |
| 27 | 23 | 0.49 | 0.5 | Si | 0.29 | *0.07 | 0.5 | 36 | 0.38 | 2.0 |
| 28 | 24 | 0.49 | *3.2 | B | 0.09 | 0.04 | 0.5 | 30 | 0.47 | 3.7 |
| 29 | 21 | 0.42 | 0.4 | — | 0.24 | 0.00 | *3.2 | 33 | 0.42 | 3.6 |
| 30 | 22 | 0.58 | 2.2 | — | 0.19 | 0.00 | 2.0 | 32 | 0.44 | *4.2 |
| 31 | 25 | 0.58 | 0.5 | — | 0.28 | 0.00 | 1.5 | 35 | 0.40 | 2.0 |
| 32 | 26 | 0.58 | 0.5 | Nb | 0.29 | 0.03 | 1.3 | 37 | 0.37 | 1.8 |
| 33 | 27 | 0.48 | 0.4 | B | 0.09 | 0.05 | 0.5 | 31 | 0.45 | 2.7 |
| 34 | 28 | 0.67 | 0.8 | — | 0.38 | 0.00 | 0.4 | 38 | 0.36 | 2.4 |
| 35 | 29 | 0.42 | 0.5 | V | 0.04 | 0.05 | 2.0 | 29 | 0.48 | 2.5 |
| 36 | 30 | 0.43 | 0.6 | Zr | 0.28 | 0.01 | 0.6 | 36 | 0.39 | 2.4 |
| 37 | 31 | 0.52 | 1.0 | — | 0.38 | 0.00 | 0.5 | 38 | 0.37 | 1.5 |
| 38 | 32 | 0.43 | 2.0 | W | 0.38 | 0.01 | 0.8 | 39 | 0.35 | 2.8 |

*represents a feature out of this embodiment.

Next, the Tools of Examples of the present invention 1 to 12 and the Tools of Comparative Examples 21 to 38 were subjected to a cutting test under the following conditions.

Work Material: round bar having eight longitudinal grooves at equal intervals in a length direction of JIS•Scr420 (60 HRC)

Cutting Speed: 200 m/min
Cut: 0.05 mm
Feed: 0.05 mm/rev.
Cutting Time: 15 minutes Under the above conditions, a dry strong intermittent cutting test for chrome steel was performed. A wear width of a flank face of the cutting edge was measured, and the presence or absence of the occurrence of fractures was observed. Table 7 shows the results of the test.

From these results, the Tools of Examples of the present invention 1 to 12 are found to have both excellent fracture resistance and excellent wear resistance under strong intermittent cutting conditions.

INDUSTRIAL APPLICABILITY

A surface-coated cutting tool according to the invention exhibits excellent fracture resistance and wear resistance in cutting under strong intermittent cutting conditions for alloy steel, and even in high-speed continuous cutting of various work materials accompanied with generation of high heat, and exhibits excellent cutting performance for a long period of time. Accordingly, the surface-coated cutting tool according to the invention can sufficiently satisfactorily meets an

TABLE 7

| Type | | Wear Amount of Flank Face (mm) | Presence or Absence of Fractures | Type | | Wear Amount of Flank Face (mm) | Presence or Absence of Fractures | Type | | Wear Amount of Flank Face (mm) | Presence or Absence of Fractures |
|---|---|---|---|---|---|---|---|---|---|---|---|
| Tools of Examples of the present invention | 1 | 0.06 | None | Tools of Comparative Examples | 21 | 0.21 | None | Tools of Comparative Examples | 33 | 0.27 | None |
| | 2 | 0.09 | None | | 22 | 0.30 | None | | 34 | *8 | Occurred |
| | 3 | 0.08 | None | | 23 | 0.25 | None | | 35 | *6 | Occurred |
| | 4 | 0.10 | None | | 24 | *6 | Occurred | | 36 | *5 | Occurred |
| | 5 | 0.08 | None | | 25 | 0.26 | None | | 37 | 0.27 | None |
| | 6 | 0.11 | None | | 26 | *11 | Occurred | | 38 | *10 | Occurred |
| | 7 | 0.09 | None | | 27 | 0.24 | None | | | | |
| | 8 | 0.07 | None | | 28 | 0.22 | None | | | | |
| | 9 | 0.13 | None | | 29 | *15 | Occurred | | | | |
| | 10 | 0.10 | None | | 30 | *12 | Occurred | | | | |
| | 11 | 0.06 | None | | 31 | *4 | Occurred | | | | |
| | 12 | 0.08 | None | | 32 | 0.19 | None | | | | |

In the Tools of Comparative Examples,
*represents a cutting time (min) until the service life of the tool is reached due to the occurrence of chipping.

According to the results of Table 7, the average wear width of the flank faces was approximately 0.09 mm in the Tools of Examples of the present invention 1 to 12. In the Tools of Comparative Examples 21 to 38, wear of the flank faces progressed, and thus the wear amount increased. In addition, in some cases, the end of the service life of the tool was reached in a relatively short period of time due to the occurrence of fractures.

increase in the performance of machine tools, and power saving, energy saving, and cost reduction in cutting.

REFERENCE SIGNS LIST

1: tool body (cBN substrate)
2: hard coating layer
2A: A layer
2B: B layer

The invention claimed is:

1. A surface-coated cubic boron nitride sintered material tool comprising:
   a tool body which is made of a cubic boron nitride sintered material; and
   a hard coating layer formed on a surface of the tool body, the hard coating layer being made of an alternate laminated structure, in which at least one A layer and at least one B layer are alternately laminated, and having a total layer thickness of 0.7 to 4.0 μm,
   wherein (a) the cubic boron nitride sintered material has a composition including:
   10 to 50 vol % of one or more of TiC, TiN, and TiCN;
   0.1 to 2 vol % of WC;
   0.3 to 5 vol % of AlN;
   2 to 10 vol % of $TiB_2$;
   1.5 to 10 vol % of $Al_2O_3$; and
   30 to 80 vol % of cBN (cubic boron nitride),
   (b) the A layer is a Ti and Al complex nitride layer, which has an average single layer thickness of 0.1 to 3.0 μm and has an average composition satisfying $0.4 \leq x \leq 0.7$ (x represents a content ratio of Al in terms of atomic ratio) in a case where the A layer is represented by a composition formula $(Ti_{1-x}Al_x)N$,
   (c) the B layer is a Cr, Al and M complex nitride layer, which has an average single layer thickness of 0.6 to 3.0 μm and has an average composition satisfying $0.03 \leq y \leq 0.4$ and $0 \leq z \leq 0.05$ (y represents a content ratio of Al in terms of atomic ratio, z represents a total content ratio of the component M in terms of atomic ratio, and the component M represents one or more elements selected from group 4a elements excluding Cr, group 5a elements, group 6a elements, B and Si in the periodic table) in a case where the B layer is represented by a composition formula $(Cr_{1-y-z}Al_yM_z)N$, and
   (d) a hardness of the B layer obtained by performing a nano-indentation test with a load set such that an indentation depth is 1/10 or less of the layer thickness is in a range of 28 to 40 GPa, and a value of a plastic deformation work ratio $W_{plast}/(W_{plast}+W_{elast})$ is in a range of 0.35 to 0.50.

2. The surface-coated cubic boron nitride sintered material tool according to claim 1 wherein,
   the cubic boron nitride sintered material contains cubic boron nitride grains, and
   a total volume percentage (vol %) of the cubic boron nitride grains having a grain size of 3D (μm) or more is 5 vol % or less, where D is an average grain size of cubic boron nitride grains in a raw material powder used for producing the cubic boron nitride sintered material.

3. The surface-coated cubic boron nitride sintered material tool according to claim 1 wherein,
   the cubic boron nitride sintered material contains cubic boron nitride grains, and
   a total volume percentage (vol %) of the cubic boron nitride grains having a grain size of 3D' (μm) or more is 5 vol % or less, wherein D' is an average grain size of cubic boron nitride grains in the cubic boron nitride sintered material.

4. The surface-coated cubic boron nitride sintered material tool according to claim 1, wherein the A layer is directly disposed on an upper surface of the tool body.

5. The surface-coated cubic boron nitride sintered material tool according to claim 1, wherein the hard coating layer comprises multiple A layers and B layers, and
   a layer of the multiple A layers located closest to the tool body is directly disposed on an upper surface of the tool body.

6. The surface-coated cubic boron nitride sintered material tool according to claim 1, wherein the cubic boron nitride sintered material contains AN in the range of 0.3 to 2.7 vol %.

* * * * *